United States Patent [19]

Gambino et al.

[11] Patent Number: 5,331,589
[45] Date of Patent: Jul. 19, 1994

[54] MAGNETIC STM WITH A NON-MAGNETIC TIP

[75] Inventors: Richard J. Gambino, Yorktown Heights; Ralph Ruf, New City, both of N.Y.; Elia Zeldov, Rehovot, Israel

[73] Assignee: International Business Machines Corporation, Armonk, N.Y.

[21] Appl. No.: 968,772

[22] Filed: Oct. 30, 1992

[51] Int. Cl.$^5$ .................... G11C 11/00; G11C 11/18
[52] U.S. Cl. ........................ 365/151; 365/9; 365/170
[58] Field of Search ............ 365/151, 174, 170, 171, 365/9; 369/126; 250/306

[56] References Cited

U.S. PATENT DOCUMENTS

| | | | |
|---|---|---|---|
| 3,846,770 | 11/1974 | Schwee et al. | 365/88 |
| 4,575,822 | 3/1986 | Quate | 365/174 |
| 5,068,826 | 11/1991 | Matthews | 365/170 |
| 5,144,581 | 9/1992 | Toda et al. | 365/151 |

OTHER PUBLICATIONS

J. J. Coughlin et al., "Non-Destructive Readout for Thin Film Memory", IBM Technical Disclosure Bulletin, vol. 3, No. 10, Mar. 1961, p. 61.
J. R. Kirtley et al., IBM F. Res. Dev. 32, 414 (1988), "Scanning tunneling measurements of potential steps at grain boundaries in the presence of current flow".
J. P. Pelz et al., Rev. Sci. Instrum. 60, 301 (1989), "Extremely low-noise potentiometry with a scanning tunneling microscope".
H. J. Mamim et al., Appl. Phys. Lett. 55, 318 (1989), "Magnetic force microscopy of thin Permalloy films".

*Primary Examiner*—Joseph A. Popek
*Attorney, Agent, or Firm*—Robert M. Trepp

[57] ABSTRACT

An apparatus and method for imaging the magnetic structure and the magnetic domains of a sample is described incorporating a scanning tunneling microscope (STM), a voltage generator for varying the voltage on the tip, an ammeter for measuring the current through the tip, circuitry to determine the tip voltage at zero current and a current source for passing current longitudinally through the sample. The invention may further include an applied magnetic field in the plane of the sample and orthogonal to current passing through the sample. A high density non-volatile memory is described incorporating the above apparatus except for the applied magnetic field and further incorporating a layer of ferromagnetic material having magnetic domains therein indicative of information.

19 Claims, 4 Drawing Sheets

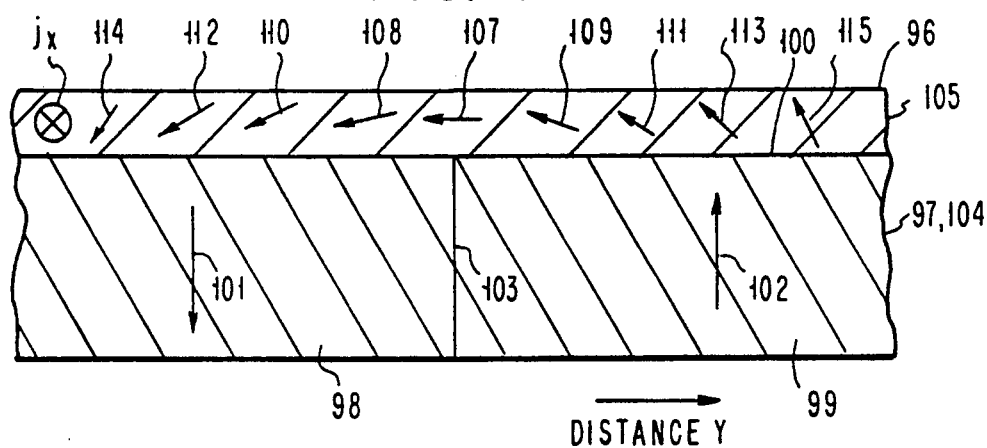
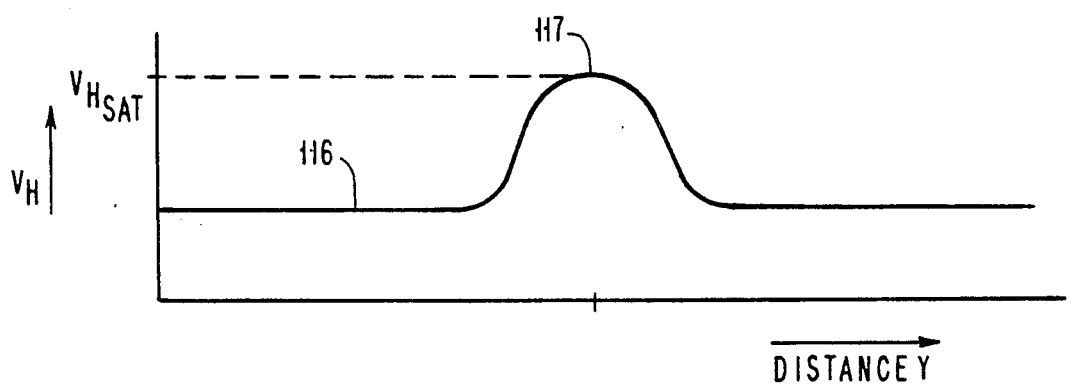
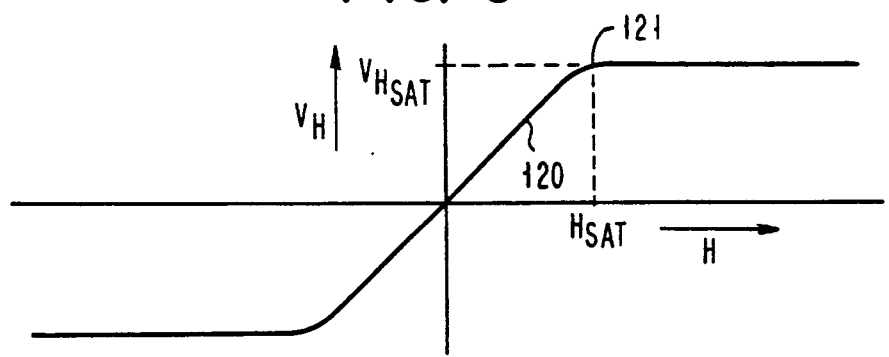

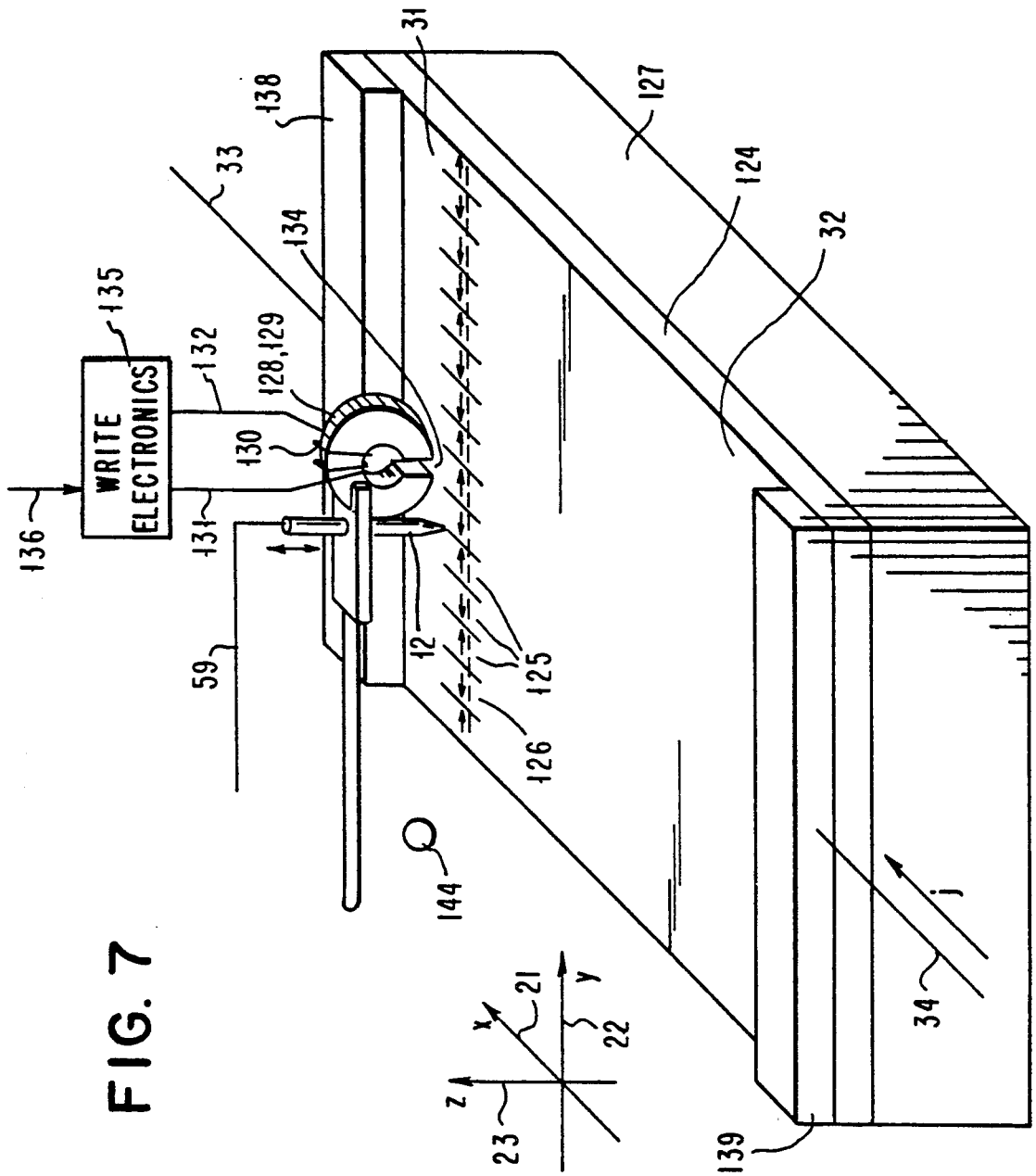

MAGNETIC STM WITH A NON-MAGNETIC TIP

BACKGROUND OF THE INVENTION

1. Field of the Invention

This invention relates to scanning tunneling microscope (STM) and more particularly to high resolution imaging of magnetic structures with a non-magnetic tip.

2. Background Art

Imaging magnetic domains and other magnetic structures is important in industry in order to develop improved high density magnetic and magneto-optic storage products. The resolution of a scanning magnetic force microscopy (MFM) is of the order 100 nanometers. The resolution of a tunneling stabilized MFM is also of the order of 100 nanometers. A spin polarized scanning tunneling microscopy (SP-STM) has a much higher resolution than 100 nanometers but requires atomically clean surfaces and ultra high vacuum (UHV) conditions so that the spin polarization of the tunneling electrons is not perturbed by surface contamination. Further, if the spin polarized tip of a SP-STM is magnetic, the stray magnetic fields from the tip can modify the magnetic state of the sample being examined.

In a publication by J. R. Kirtley et al., IBM J. Res. Develop. 32, 414(1988), entitled "Scanning tunneling measurements of potential steps at grain boundaries in the presence of current flow", a scanning tunneling microscope with a Pt-Rh tunneling tip was used at voltages low in comparison to the tunneling barrier potential (typically a few electron volts). A Au-Pd film was examined at room temperature in vacuum wherein the current-voltage characteristic did not pass through the origin, because an externally applied transverse current through the film had changed the potential directly below the tip relative to ground.

A publication by J. P. Pelz et al., Rev. Sci. Instrum. 60, 301 (1989), entitled "Extremely low-noise potentiometry with a scanning tunneling microscope", extremely loss-noise potentiometry was described utilizing an STM to make extremely low-noise potentiometry measurements in metallic materials at room temperature.

In a publication by H. J. Mamin et al., Appl. Phys. Lett. 55, 318 (1989), entitled "Magnetic force microscopy of thin Permalloy films", the magnetic tip of a magnetic force microscope (MFM) was oscillated close to soft magnetic films. Changes in force derivative at the tip result in changes in resonant frequency, which are sensed as changes in the oscillation amplitude. A MFM image was made with the tip was scanned at a constant height of 150 nanometers above the surface of thin-film samples of Permalloy. Images were made clearly showing domain walls and the classic closure structure.

In U.S. Pat. No. 3,846,770 which issued on Nov. 5, 1974, to L. J. Schwee, a polycrystalline thin film strip such as Permalloy is used to store information in a serial manner in the form of reversal domains. The reversal domains are propagated along the hard axis of the thin film strip and then sensed by conventional sensing devices to detect the stored information. A semiconductor element may be placed adjacent to the path of reversal domains. The semiconductor utilizes the Hall effect and a Hall voltage is sensed as a result of the stray magnetic field of the domain as it passes below the semiconductor element.

SUMMARY OF THE INVENTION

In accordance with the present invention an apparatus and method for imaging the magnetic structure and the magnetic domains of a sample is described comprising; passing a current in a first direction through the sample parallel to the surface of the sample, scanning with a scanning tunneling microscope (STM) with a scanning tip clamped to a fixed tunneling gap between the tip and the surface of the sample, varying the voltage between the tip and the sample, monitoring the current between the tip and the sample whereby variations in the Hall potential are obtained with a resolution limited only by the scattering length of the electrons which is on the order of the mean free path of the current carriers. The sample may be ferromagnetic, paramagnetic, a semi-conductor, or an insulator. In a variation of the invention, a magnetic field H may be applied orthogonal to the current which is passed in a first direction through the sample.

The invention further provides a high-density non-volatile memory comprising a layer of magnetic material having magnetic domains therein, a recording head or thermal means using a laser or STM tip for writing information into the layer of magnetic material by modifying the magnetic domains, a reading head for reading the information by detecting the magnetic domains including a scanning tunneling microscope (STM) positioned to scan the surface of the layer of magnetic material, a current source for passing current in a direction through the layer of the magnetic material parallel to the surface of the layer, a circuit for varying the voltage between a tip of the STM and the layer of magnetic material, and a circuit for monitoring the current between the tip and the layer of magnetic material whereby variations in the Hall potential are obtained indicative of the information stored therein. The magnetic material may further include an insulating layer and a conductive layer thereover to provide a conductive Hall effect transducer thereon.

It is an object of the invention to provide a broad STM technique applicable to conducting, semiconducting and conducting and non-conducting magnetic materials for testing and for storage of data.

It is a further object of the invention to provide a storage technique which is not defraction limited in readout of the data stored.

Brief Description of the Drawing

These and other features, objects and advantages of the present invention will become apparent upon a consideration of the following detailed description of the invention when read in conjunction with the drawing, in which:

FIG. 4 is a cross-section view of an alternate embodiment of the invention showing a sample and a conductive Hall effect transducer.

FIG. 5 is a graph of the Hall voltage $V_H$ vs. distance along the sample.

FIG. 6 is a graph of the Hall voltage $V_H$ vs. applied field H for Permalloy; and FIG. 7 is a perspective view of an alternate embodiment of the invention showing a memory.

DESCRIPTION OF THE PREFERRED EMBODIMENT

Figure 1:
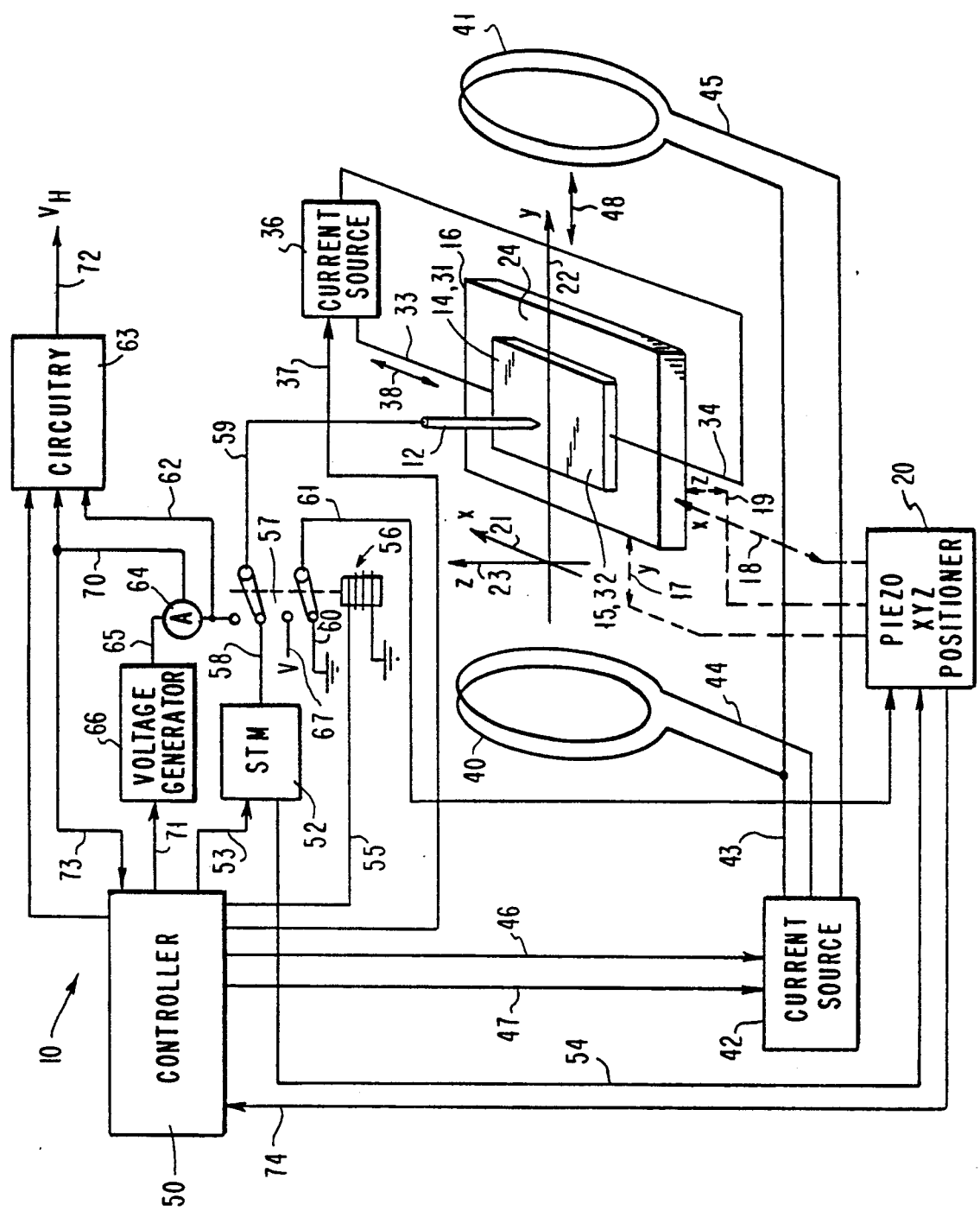
FIG. 1 is one embodiment of the invention.

Referring now to the drawings, FIG. 1 shows a magnetic STM 10 with a non-magnetic tip 12 for imaging the magnetic structure and the magnetic domains of a sample 14. Non-magnetic tip 12 may be held stationary while table 16 upon which sample 14 is positioned can be moved in the X, Y and Z direction by way of mechanical linkages 17 through 19, respectively, from piezo XYZ positioner 20. Arrows 21–23 show the XYZ directions in three dimensional space with respect to table 16. Arrows X and Y are in the plane of the surface of table 16 while arrow 23 is vertical or orthogonal to the surface 24 of table 16. Sample 14 may be for example a ferromagnetic material which may be conductive or non-conductive to electrical current or, sample 14 may be a paramagnetic material which is non-conductive with a conductive Hall effect transducer thereon. Sample 14 has a first side or end 31 and a second side or end 32 adapted for coupling to leads 33 and 34 respectively. Current source 36 which functions to provide a predetermined current in response to a control signal on lead 37. Current source 36 is coupled to leads 33 and 34 to pass a current in a longitudinal direction through sample 14. Current source 36 may cause current to flow forward or in the reverse direction as shown by arrow 38 in response to a control signal on lead 37. Lead 34 may be coupled to ground potential. Sample 14 may also be subjected to an magnetic field having a component substantially parallel to the surface of sample 14 and orthogonal to the flow of current through sample 14. The magnetic field may be provided by coils 40 and 41 which may be Helmholtz coils if a uniform magnetic field is desired in the region of sample 14. Current source 42 may be coupled over lead 43 to one end of coils 40 and 41. The other end of coil 40 is coupled over lead 44 to current source 42. The other end of coil 41 is coupled over lead 45 to current source 42. Current source 42 responds to control signals on leads 46 and 47 to provide a predetermined amount of current to coils 40 and 41, respectively, to provide a magnetic field H shown by arrow 48 wherein the field may be reversed in direction by reversing the direction of current through coils 40 and 41. If sample 14 is ferromagnetic, the presence of an applied magnetic field H will cause the magnetic domains to expand and contract depending upon their magnetization and may cause domain walls to move to accommodate the expansion and contraction of various magnetic domains. If sample 14 contains paramagnetic material of interest then an applied magnetic field H is necessary to align up the magnetic moments.

Magnetic STM 10 also includes a controller 50 and a STM 52 which may include piezo XYZ positioner 20 table 16 and tip 12. STM 52 may be a commercially available scanning tunneling microscope for scanning the upper surface 15 of sample 14. Controller 50 has a control signal coupled over lead 53 to a control input of STM 52. STM 52 in response to a control signal in lead 53 generates a control signal over lead 54 to piezo XYZ positioner 20 to cause table 16 to move permitting tip 12 to scan upper surface 15 of sample 14. At times STM 52 is scanning, it is scanning with a fixed tunneling gap between tip 12 and upper surface 15 of sample 14. Scanning may be accomplished by way of piezo XYZ positioner 20 or by positioning tip 12.

Controller 50 provides a control signal over lead 55 to solenoid 56 which is mechanically coupled to a double throw switch 57. When switch 57 is in a first position STM 52 is coupled to tip 12 by way of lead 58 which is coupled to one pole of switch 57 to lead 59 and tip 12. A voltage such as ground is coupled over lead 60 to the other pole of switch 57 in the first position to lead 61 which is coupled to a control input of piezo XYZ positioner 20. When switch 57 is in the first position, the control signal on lead 61 allows piezo XYZ positioner 20 to operate in the XYZ directions. At times double pole double throw switch 57 is in the second position, tip 12 is coupled by way of lead 59 to lead 62 to circuitry 63 and to one side of ammeter 64. The other side of ammeter 64 is coupled over lead 65 to the output of voltage generator 66. Voltage generator 66 functions to provide a scanning voltage through ammeter 64 to tip 12. The second pole of switch 57 is coupled over lead 67 to a voltage V which is coupled to lead 61. The presence of voltage V on lead 61 causes piezo XYZ positioner 20 to be clamped or inhibited from moving in the Z direction. Thus when switch 57 is in the second position, scanning tip 12 is clamped to a fixed tunneling gap between tip 12 and upper surface 15 of sample 14. Voltage generator 66 varies the voltage between tip 12 and sample 14. Ammeter 64 monitors the current between tip 12 and sample 14 and provides an output signal indicative of the current over lead 70 to controller 50 in circuitry 63. Controller 50 provides a control signal over lead 71 to voltage generator 66 which may, for example, initiate the cycling of voltage generator 66 and may control the voltage wayform over time. Circuitry 63 functions to respond to the current on lead 70 and the voltage on lead 62 to provide an output signal over lead 72 indicative of the Hall voltage $V_H$. The Hall voltage $V_H$ is generally the voltage on lead 62 at times the current through ammeter 64 is zero. Some calibration may be necessary to factor in the position of tip 12 on sample 14 with respect to the resistance of sample 14 and the current flowing through sample 14 from first hand 31 to second hand 32. Controller 50 may provide a calibration voltage over lead 73 to circuitry 63. Piezo XYZ positioner 20 may provide a signal indicative of position over lead 74 to controller 50. Thus, if the initial position and the geometry of sample 14 is known with respect to first and second hands 31 and 32, controller 15 may provide a calibration voltage over lead 73 if controller 50 has been initialized with the resistivity of sample 14. At times controller has positioned switch 57 in the second position, control signals may activate current source 36 and current source 42 to provide a predetermined current through sample 14 and a predetermined magnetic field to sample 14.

Thus at times when controller 50 positions switch 57 in the first position, STM 52 scans upper surface 15 of sample 14 with a fixed tunneling gap between tip 12 and upper surface 15. At times controller 50 places switch 57 in the second position, piezo XYZ positioner 20 is inhibited from moving sample 14, particularly in the Z direction, and causes a varying voltage by way of generator 16 between tip 12 and sample 14 while monitoring the current by way of ammeter 64 between tip 12 and sample 14 whereby variations in the Hall potential $V_H$ are obtained with a resolution limited only by the scattering of the electrons which is on the order of the mean free path of the current carriers. Sample 14 may be a ferromagnetic material, a paramagnetic material, a semi-conductor, and an insulator having a layer of material on the surface of the insulator to provide a conductive Hall effect transducer thereon.

Controller 50, after measuring the Hall voltage with current passing from first hand 31 to second hand 32 of sample 14, controller 50 may reverse the current from current source 36 to cause the current to flow from second hand 32 to first hand 31 and repeating the step of determining the Hall voltage $V_H$ on lead 72 whereby the variations in Hall potential caused by impurity scattering, grain boundary scattering, etc., can be eliminated.

Controller 50 after measuring the Hall voltage $V_H$ may reverse the magnetic field by reversing the current through coils 40 and 41 and repeating the step of varying the voltage on tip 12 to determine the Hall voltage $V_H$ on lead 72 whereby variations in a potential caused by impurity scattering, grain boundary scattering, etc., can be eliminated. For optimum voltage, the magnetic field (H) should be orthogonal to the current in sample 14 below tip 12.

Figure 2:
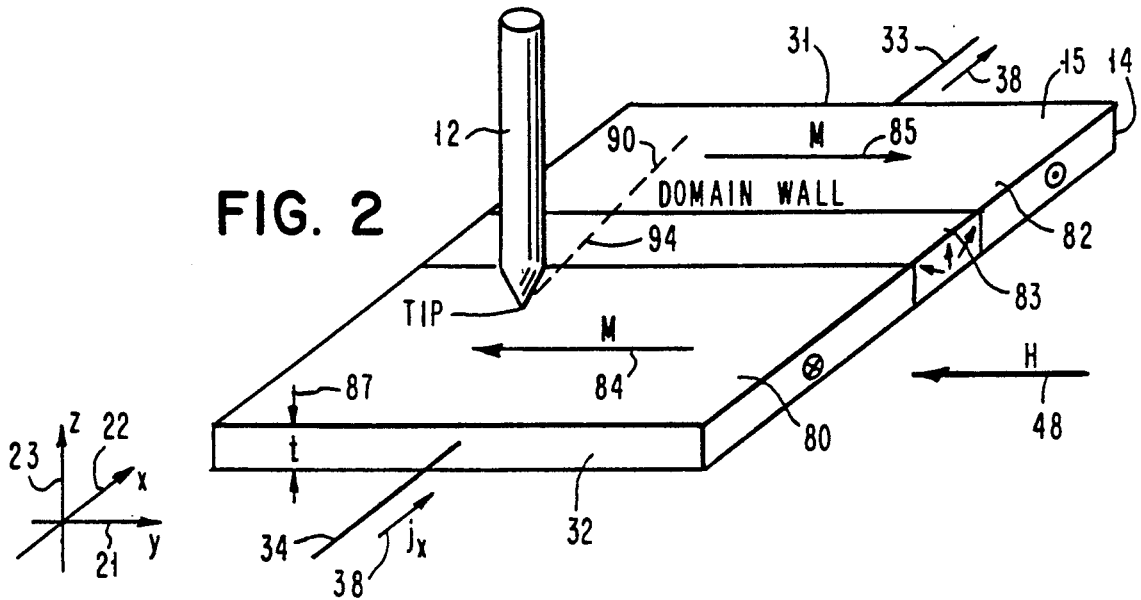
FIG. 2 is a perspective view of a STM tip and sample.

Referring to FIG. 2, a perspective view of tip 12 and sample 14 is shown in more detail. In FIG. 2, like references are used for functions corresponding to the apparatus of FIG. 1. Tip 12 may be of tungsten or Pt-Ir alloy. The direction of current as well as the current density $J_x$ is also shown by arrow 38. In order to use the Hall effect to image the magnetic state of sample 14, a current must flow through sample 14 as shown by arrow 38. The magnetic field (H) shown by arrow 48 may be applied orthogonal to the current flow shown by arrow 38 and in the plane of sample 14 is only required for examining paramagnetic or super-paramagnetic samples. In a ferromagnetic sample in the demagnetized state inzero field there will be some regions in the domain 80 and 82 or in the walls for example wall 83 shown in FIG. 2 in which the magnetization component will cause a local spontaneous Hall effect. The magnetic field shown by arrow 48 can be used to modify the domain structure of domains 80 and 82 in sample 14 where sample 14 is a ferromagnet. The imaging of the magnetic structure and the magnetic domains of sample 14 is done by scanning with STM 52 in potentiometer mode, that is the Z direction of piezo XYZ positioner 20 is clamped to fix the tunneling gap of tip 12 and the voltage between tip 12 and sample 14 is varied by way of switch 57 and voltage generator 66 and the current through lead 62 is detected by ammeter 64 and monitored by circuitry 63. When the potential of tip 12 is equal to the potential of upper surface 15 under tip 12, there will be zero current flow through lead 62. This method can be used to map out the variations in the Hall potential in sample 14. The resolution is only limited by the scattering length which is of order of the mean free path of the carriers. Other variations in potential caused by impurity scattering, grain boundary scattering, etc., can be eliminated by reversing the field shown by arrow 48 by changing the direction of current flow shown by arrow 34 with respect to a fixed domain pattern, e.g., 90° in the plane. The topography can be obtained at the same time that imaging of the magnetic structure is done by conventional constant current STM imaging. Imaging of the magnetic structure of sample 14 is best done when sample 14 is in the form of a thin film, sheet or slab and is conducting. The thickness of sample 14 t is shown by arrow 87 in FIG. 2.

A magnetic domain is defined as a region of uniform magnetization vector. Where the magnetization vector M is in the XY plane, $\rho_s + \rho_o = \rho_H = E_z/j_x$ where $\rho_o$ is the ordinary Hall resistivity due to an applied field such as shown by arrow 48 in FIG. 2. $\rho_o$ is normally small compared to $\rho_s$ which is the constant for spontaneous magnetization. Generally, $\rho_H$ is constant for a selected material. $\rho_H$ is expressed in equation 1.

$$\rho_H = E_z/j_x \tag{1}$$

In equation 1 $E_z$ represents the electric field in the Z direction and $j_x$ represents the current density in the X direction. The Hall voltage $V_H$ is given by equation 2

$$V_H = E_z t = \rho_H j_x t \tag{2}$$

where t is the thickness of sample 14. Where $\rho_H$ is equal to $2 \times 10^6$ Ω cm, $j_x = 10^6$ amperes per cm$^2$ and $t = 10^{-5}$ cm, the Hall voltage $V_H = 2 \times 10^{-5}$ volts which = 20µ volts.

Figure 3:
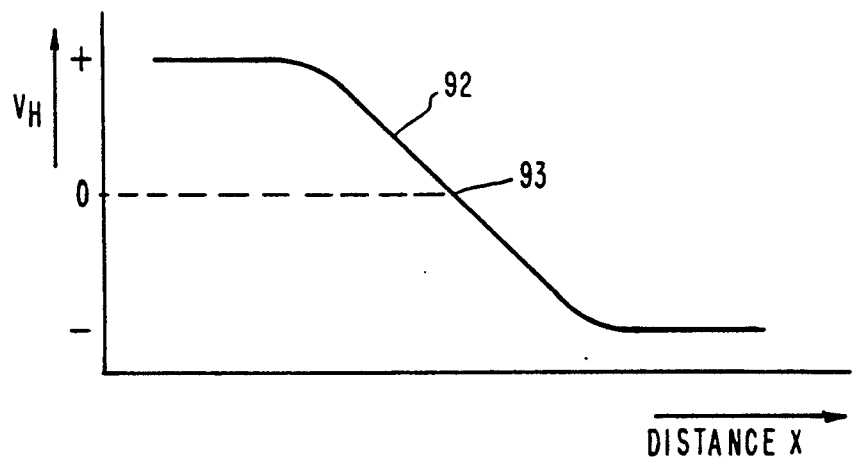
FIG. 3 is a graph of the Hall voltage $V_H$ vs. distance along the sample shown in FIG. 2.

Referring to tip 12 which may follow a path 90 over sample 14, the corresponding Hall voltage is shown by curve 92 in FIG. 3. In FIG. 3 the ordinate represents $V_H$ and the abscissa represents distance along path 90 which is in the X direction. Curve 92 is equal to zero at point 93 which corresponds to point 94 along path 90. The applied magnetic field shown by arrow 48 was zero. The Hall voltage went from a positive voltage to a negative voltage due to reversal of the magnetization shown by arrows 84 and 85 in domains 80 and 82, respectively.

FIG. 4 is a cross-section view of sample 96 comprising a layer of ferromagnetic material 97 having domains 98 and 99 which are perpendicular with respect to the upper surface 100 of ferromagnetic layer 97 shown by arrows 101 and 102. The contiguous interface of domains 98 and 99 forms domain wall 103. To image magnetic domains 98 and 99 in a magnetic insulator such as a magnetic garnet for example gadolium iron garnet (GdIG), yttrium iron garnet (YIG), etc., a conductive Hall effect transducer must be provided. The transducer may be a layer 105 of material with a large spontaneous Hall effect which responds to the stray fields produced by the domain walls such as wall 103 in ferromagnetic layer 97 which may be, for example, a garnet. Layer 105 is formed on garnet layer 104 by evaporation or sputtering. For example, a 20 manometer thick film of Permalloy is formed on garnet layer 104 with a perpendicular easy access anisotropy. The transducer layer 105 of Permalloy has very large in-plane magnetic domains, much larger than the bubble domains in the garnet which are a few micrometers in diameter. Permalloy is a trade name for any of several highly magnetically permeable iron-base alloys containing about 45–80% nickel.

The transducer layer of Permalloy adjacent to domain wall 103 in the garnet layer 104 is magnetized in plane as shown by arrow 107 in FIG. 4. On either side of domain wall 103, the magnetization vector is tilted out of the plane shown by arrows 108 and 109 so that the Hall signal $V_H$ is decreased. Arrows 110 through 114 show the direction of magnetization away from domain wall 103. Thus, domain walls in an insulating perpendicular anisotropy material like a garnet can be imaged to show the magnetic structure and the magnetic domains. Amorphous materials are especially well suited as suitable for transducer layer 105 because amorphous materials have a large spontaneous Hall effect and good soft magnetic properties. Another type of material suitable for transducer layer 105 is a paramagnetic alloy. For example, amorphous godolinium gold (GdAu) alloy has a high spontaneous Hall effect and is paramagnetic at room temperature.

FIG. 5 is a graph of the Hall voltage $V_H$ vs. distance over sample 96. In FIG. 5 the ordinate represents voltage and the abscissa represents distance along the scanned path which corresponds to the cross-section in FIG. 4. Curve 116 shows the Hall voltage due to the magnetization shown by arrows 108 through 114. The maximum Hall voltage $V_{HSAT}$ is the saturation voltage. Point 117 on curve 116 corresponds to a tip position above domain wall 103 where the magnetization is in the plane of transducer layer 105 shown by arrow 107.

FIG. 6 is a graph of a Hall voltage $V_H$ vs. applied magnetic field H for Permalloy. In FIG. 6 the ordinate represents Hall voltage $V_H$ and the abscissa represents applied magnetic field H. Curve 12 in FIG. 6 shows that the Hall voltage $V_H$ is linear to the applied field H below the value $H_{SAT}$. $H_{SAT}$ is given by equation 3 for Permalloy. It is about 10KOe.

$$H_{SAT} = 4\pi M_s \qquad (3)$$

FIG. 6 shows the spontaneous Hall effect voltage which is that part of the Hall effect that is proportional to the magnetization M whereas that part of the Hall effect that is proportional to the applied field is much smaller than the spontaneous Hall effect voltage. Point 21 on curve 120 corresponds to the saturation or maximum Hall voltage arising from the spontaneous Hall effect.

In addition to magnetic domain imaging, the magnetic STM 10 shown in FIG. 1 may be useful for data readout in very high density magnetic storage products. FIG. 7 shows a perspective view of a memory comprising a layer 124 of magnetic material having magnetic domains 125 positioned along a path 126. Magnetic layer 124 may be a ferromagnetic metal and may be supported by a disk or substrate 127. Magnetic head 128 comprising a horseshoe shaped electromagnet 129 with coil 130. A current pulse is provided on leads 131 and 132 which provides a magnetic field in layer 124 below opening 134. Leads 131 and 132 are coupled to write electronics 135 which functions to write data in response to the data on lead 136. A STM tip 12 may be mechanically attached to magnetic head 128 or it may be positioned independently of head 128. A current may flow through layer 124 from first hand 31 to second hand 32 by way of leads 33 and 34 and low resistance electrodes 138 and 139 which are in low ohmic contact to layer 124. In FIG. 7 like references are used for functions corresponding to the apparatus of FIGS. 1 and 2. Tip 12 is moved along path 126 and magnetic transitions arising from magnetic domains 125 are read out during a time when current is passed through layer 124 by way of leads 33 and 34. It is not necessary to scan tip 12 at tunneling distances i.e., 100 Ås. Tip 12 can be operated in the field ionization mode or capacitive mode at a greater distance in the range from 50 to 200 nanometers and preferably about 100 nanometers. To insure proper field emission from tip 12, layer 124 should be placed in a chamber and the chamber should be evacuated to a lower pressure such as 10 Mtorr. A suitable gas between tip 12 and layer 124 may be argon or other inert gas. The local variations in Hall voltage using the apparatus shown in FIG. 1 are used to detect the magnetic transitions between magnetic domains 125. Because tip 12 can be scanned at a distance of order of 100 nanometers, it is possible to scan at high velocity to obtain practical data rates of order of 10 MHz.

It is known in the art that very small magnetic domains 125 can be written either thermomagnetically or with an inductive recording head such as magnetic head 128 shown in FIG. 7. For writing thermomagnetically, a laser is used to heat a localized region of layer 124 and a magnetic field is applied to the heated region such as by magnetic head 128. A current pulse through the probe tip may also be used for local heating.

While there has been described and illustrated an apparatus and method for imaging the magnetic structure and the magnetic domains of a sample and also a high density non-volatile memory, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for imaging the magnetic structure and the magnetic domains of a sample comprising the steps of:

passing a current in a first direction through said sample substantially parallel to the surface of said sample, scanning with a scanning tunneling microscope (STM) with its scanning tip clamped to a fixed tunneling gap between said tip and the surface of said sample, varying a voltage between said tip and said sample, monitoring a current between said tip and said sample whereby variations in the Hall potential are obtained with a resolution limited only by the scattering length which is on the order of the mean free path of the current carriers in said sample, said Hall potential being perpendicular to both the direction of magnetization and the direction of said current through said sample.

2. The method of claim 1, further including the step of changing said direction of current flow from said first direction to a second direction through said sample substantially parallel to the surface of said sample and repeating the step of scanning with a scanning tunneling microscope (STM) whereby the variations in surface potential caused by impurity scattering or grain boundary scattering can be eliminated.

3. The method of claim 1, further including the steps of applying a magnetic field (H) orthogonal to said current.

4. The method of claim 3, further including the step of selecting a sample which is paramagnetic.

5. The method of claim 3, further including the step of selecting a sample which is a semiconductor.

6. The method of claim 3, further including the steps of selecting an initial sample which is an insulator and depositing a layer of material on the surface of said insulator to provide a conductive or semiconducting Hall effect transducer thereon.

7. The method of claim 6, further including the step of selecting said material to form said layer of material on the surface of said insulator selected from the group consisting of amorphous materials having a large spontaneous Hall effect, a paramagnetic alloy, a high permeability magnetic material over 100.

8. The method of claim 3, further including the step of selecting an initial sample of magnetic garnet and depositing a layer of conductive material on the surface of said garnet to provide a conductive Hall effect transducer thereon.

9. The method of claim 1, further including the step of reversing a magnetic field (H) and repeating the step of scanning with a scanning tunneling microscope (STM) whereby variations in the potential caused by impurity scattering or grain boundary scattering, can be eliminated.

10. The method of claim 1, further including the step of selecting a sample which is ferromagnetic.

11. A high density non-volatile memory comprising:
a layer of magnetic material having magnetic domains therein,
means for writing information into said layer of magnetic material by modifying said magnetic domains,
means for reading said information by detecting said magnetic domains including a scanning tunneling microscope (STM) positioned to scan the surface of said layer of magnetic material,
means for passing current in a first direction through said layer of magnetic material parallel to the surface of said layer,
means for applying and varying a voltage between a tip of said STM and said layer of magnetic material,
means for monitoring a current between said tip and said layer of magnetic material whereby variations in the Hall potential are obtained indicative of said information said Hall potential being perpendicular to both the direction of magnetization and the direction of said current through said sample.

12. The memory of claim 11 wherein said layer of magnetic material further includes an insulator layer and conductive layer thereover to provide a conductive Hall effect transducer thereon.

13. The memory of claim 11, wherein said layer of magnetic material includes a first layer of magnetic garnet and a second layer of material on the surface of said first layer to provide a conductive Hall effect transducer thereon.

14. The memory of claim 11, wherein said tip of said STM is positioned to scan at a distance in the range from 5 to 50 Å from said layer of magnetic material to provide a quantum mechanic tunnel current between said tip and said layer of magnetic material.

15. The memory of claim 11, wherein said STM has a gas atmosphere at low pressure and said tip of said STM is positioned to scan at a distance in the range from 50 to 1000 Å from said layer of magnetic material whereby field ionization of said gas at said tip occurs to provide a substantially ion current between said tip and said layer of magnetic material.

16. The memory of claim 11 further including a thin layer of gold over said layer of magnetic material and wherein said tip of said STM is positioned to scan in ohmic contact with said layer of gold to provide an ohmic current between said tip and said layer of magnetic material.

17. The memory of claim 11, further including a thin layer of insulation over said layer of magnetic material and wherein said tip of said STM is positioned to scan in contact with said layer of insulation to provide a capacitive current between said tip and said layer of magnetic material.

18. A high density non-volatile memory comprising:
a layer of material capable of exhibiting a plurality of Hall potentials,
means for writing information into said layer of material by modifying said Hall potentials as a function of position on said layer,
means for reading said information by detecting said Hall potentials including a scanning tunneling microscope (STM) positioned to scan the surface of said layer of material,
means for passing current in a first direction through said layer of material parallel to the surface of said layer,
means for applying and varying a voltage between a tip of said STM and said layer of material,
means for monitoring a current between said tip and said layer of material,
whereby variations in the Hall potential are obtained indicative of said information, said Hall potential being perpendicular to both the direction of magnetization and the direction of said current through said sample.

19. The memory of claim 18, further including means to provide a raster scan by said scanning tunneling microscope (STM).

* * * * *